United States Patent
Yang (10) Patent No.: US 9,105,587 B2
(45) Date of Patent: Aug. 11, 2015

(54) METHODS OF FORMING SEMICONDUCTOR STRUCTURES WITH SULFUR DIOXIDE ETCH CHEMISTRIES

(71) Applicant: Micron Technology, Inc., Boise, ID (US)

(72) Inventor: Guangjun Yang, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/672,460

(22) Filed: Nov. 8, 2012

(65) Prior Publication Data

US 2014/0127907 A1     May 8, 2014

(51) Int. Cl.

| | |
|---|---|
| H01L 21/302 | (2006.01) |
| H01L 21/461 | (2006.01) |
| B44C 1/22 | (2006.01) |
| C03C 15/00 | (2006.01) |
| C03C 25/68 | (2006.01) |
| C23F 1/00 | (2006.01) |
| H01L 21/311 | (2006.01) |
| C09K 13/00 | (2006.01) |
| C09K 13/04 | (2006.01) |
| H01L 21/027 | (2006.01) |
| H01L 21/033 | (2006.01) |

(52) U.S. Cl.
CPC .......... *H01L 21/31138* (2013.01); *C09K 13/00* (2013.01); *C09K 13/04* (2013.01); *H01L 21/0273* (2013.01); *H01L 21/0337* (2013.01); *H01L 21/0338* (2013.01)

(58) Field of Classification Search
None
See application file for complete search history.

(56) References Cited

U.S. PATENT DOCUMENTS

| | | |
|---|---|---|
| 6,040,248 A | 3/2000 | Chen et al. |
| 6,080,678 A | 6/2000 | Yim |
| 6,187,688 B1 | 2/2001 | Ohkuni et al. |
| 6,465,159 B1 | 10/2002 | Ni et al. |
| 6,527,966 B1 | 3/2003 | Shimomura et al. |
| 6,617,257 B2 | 9/2003 | Ni et al. |
| 6,746,961 B2 | 6/2004 | Ni et al. |
| 6,797,552 B1 | 9/2004 | Chang et al. |
| 6,869,899 B2 | 3/2005 | Mahorowala et al. |
| 7,141,505 B2 | 11/2006 | Nguyen et al. |
| 7,271,106 B2 | 9/2007 | Abatchev et al. |
| 7,354,847 B2 | 4/2008 | Chan et al. |
| 7,563,723 B2 | 7/2009 | Abatchev et al. |
| 7,662,718 B2 | 2/2010 | Abatchev et al. |
| 7,670,759 B2 | 3/2010 | Morioka |
| 7,709,390 B2 | 5/2010 | Olson |
| 7,855,148 B2 | 12/2010 | Olson |
| 7,989,307 B2 | 8/2011 | Parekh et al. |
| 8,252,194 B2 | 8/2012 | Kiehlbauch et al. |

(Continued)

FOREIGN PATENT DOCUMENTS

JP     2928391 B2     8/1999

*Primary Examiner* — Stephanie Duclair
(74) *Attorney, Agent, or Firm* — TraskBritt (57) ABSTRACT

Methods of forming a semiconductor device structure and sulfur dioxide etch chemistries. The methods and chemistries, which may be plasma chemistries, include use of sulfur dioxide and a halogen-based compound to form a trimmed pattern of a patterning material, such as a resist material, at a critical dimension with low feature width roughness, with low space width roughness, without excessive height loss, and without substantial irregularities in the elevational profile, as compared to trimmed features formed using conventional chemistries and trimming methods.

24 Claims, 5 Drawing Sheets

(56) References Cited

U.S. PATENT DOCUMENTS

| | | |
|---|---|---|
| 8,266,558 B2 | 9/2012 | Wells |
| 2002/0195416 A1 | 12/2002 | Nallan |
| 2003/0017711 A1* | 1/2003 | Mahorowala et al. ........ 438/719 |
| 2004/0018738 A1 | 1/2004 | Liu |
| 2004/0060659 A1 | 4/2004 | Morioka et al. |
| 2004/0079727 A1* | 4/2004 | Taylor et al. .................... 216/67 |
| 2004/0106257 A1* | 6/2004 | Okamura et al. ............. 438/257 |
| 2004/0157169 A1* | 8/2004 | Morioka ........................ 430/325 |
| 2005/0133479 A1 | 6/2005 | Youngner et al. |
| 2006/0046483 A1* | 3/2006 | Abatchev et al. ............. 438/689 |
| 2007/0254236 A1* | 11/2007 | Allen et al. ................. 430/270.1 |
| 2008/0014533 A1* | 1/2008 | Keller et al. .................. 430/311 |
| 2008/0038927 A1* | 2/2008 | Yamaguchi et al. .......... 438/706 |
| 2008/0102643 A1* | 5/2008 | Chen et al. .................... 438/710 |
| 2008/0197109 A1 | 8/2008 | Mui et al. |
| 2008/0296732 A1 | 12/2008 | Olson |
| 2009/0017627 A1 | 1/2009 | Greeley et al. |
| 2009/0042399 A1 | 2/2009 | Smith et al. |
| 2010/0173498 A1 | 7/2010 | Abatchev et al. |
| 2011/0266647 A1* | 11/2011 | Parekh et al. ................. 257/506 |
| 2011/0294294 A1 | 12/2011 | Abatchev et al. |

* cited by examiner

METHODS OF FORMING SEMICONDUCTOR STRUCTURES WITH SULFUR DIOXIDE ETCH CHEMISTRIES

FIELD

The present disclosure, in various embodiments, relates generally to semiconductor device design and fabrication. More particularly, this disclosure relates to semiconductor fabrication involving patterning methods.

BACKGROUND

In semiconductor fabrication, integrated circuit (IC) devices are becoming smaller, faster, and more efficient, leading toward higher densities of IC devices on chips. As this trend continues, reducing critical dimension (CD) is often important. The critical dimension is the dimension of the smallest feature (e.g., interconnect line, contact, trench) that can be formed during semiconductor device fabrication. Lowering critical dimensions facilitates formation of smaller components and, therefore, increased device density. Accordingly, achieving a desired critical dimension is often a goal of patterning processes.

Figure 1:
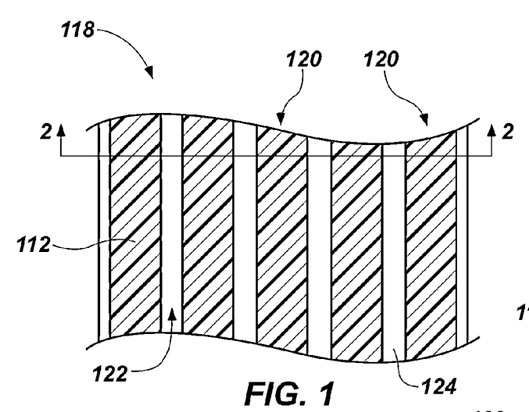
FIG. 1 is a top plan schematic illustration of a plurality of initial pattern features defining an initial pattern during a stage of fabrication of a semiconductor device structure according to an embodiment of the present disclosure.
Figure 2:
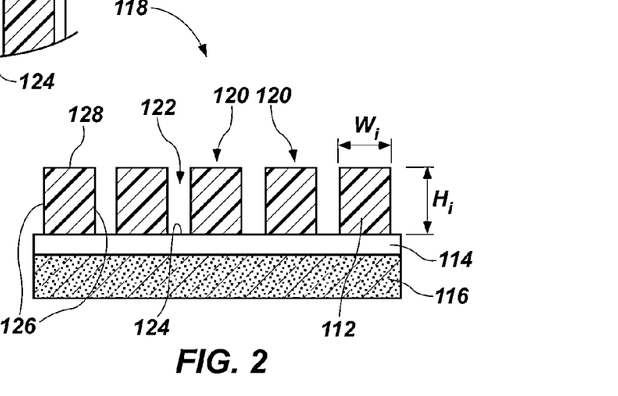
FIG. 2 is a cross-sectional elevational schematic illustration taken along line 2-2 of FIG. 1.

FIGS. 1 and 2 illustrate a stage in a conventional patterning process. According to the process, photolithography techniques are used to define a pattern in a patterning material 112 formed above a base material 114, which may be supported by a substrate 116, to be patterned. In some instances, the substrate 116 may have patterning material 112 located directly thereon for patterning of the substrate 116. The patterning material 112 is selectively exposed to an energy source, such as an actinic energy, to alter the material characteristics of the patterning material 112 in select regions such that the altered regions will be more or less susceptible to development by a developer. Such susceptibility and the response of the patterning material 112 to exposure depend upon the patterning material chemistry. For example, if the patterning material 112 is formulated as a positive tone photoresist material, exposed regions become more susceptible to development while unexposed regions (e.g., masked regions) remain less susceptible. However, if the patterning material 112 is formulated as a negative tone photoresist material, exposed regions become less susceptible to development, and the unexposed regions (e.g., masked regions) remain susceptible. Post exposure, the development-susceptible regions are selectively removed to define a pattern, referred to herein as an "initial pattern" 118, of initial features 120, which may be elongate features. As illustrated in FIGS. 1 and 2, the initial features 120 of the initial pattern 118 may be separated from one another by trenches 122, each of which may expose an upper surface 124 of the base material 114. Each initial feature 120 may be formed so as to define an initial width $W_i$ and an initial height $H_i$. The initial width $W_i$ may be of the smallest dimension achievable due to limitations of the photolithography process employed. Nonetheless, the initial width $W_i$ may not be small enough to accommodate patterning of the base material 114 at a desired critical dimension. For example, the initial width $W_i$ may be on the order of about 40 nm to about 50 nm, while the desired critical dimension may be on the order of about 20 nm to about 30 nm. Accordingly, the initial pattern 118 of the plurality of initial features 120 may be subjected to a trimming process to reduce the width of the initial features 120.

Figure 3:
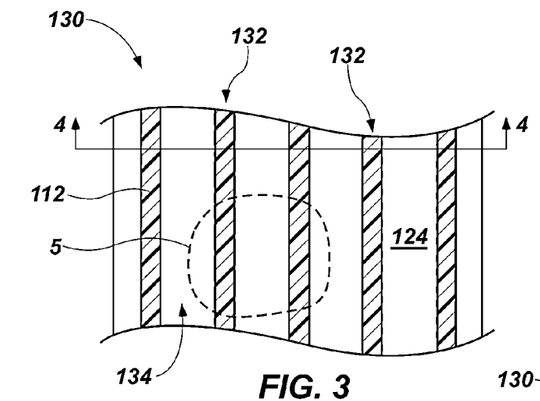
FIG. 3 is a top plan schematic illustration of a plurality of trimmed pattern features defining a trimmed pattern during a theoretical stage of fabrication of a semiconductor device structure according to a theoretical semiconductor device structure fabrication process, the illustrated stage following that illustrated in FIG. 1.
Figure 4:
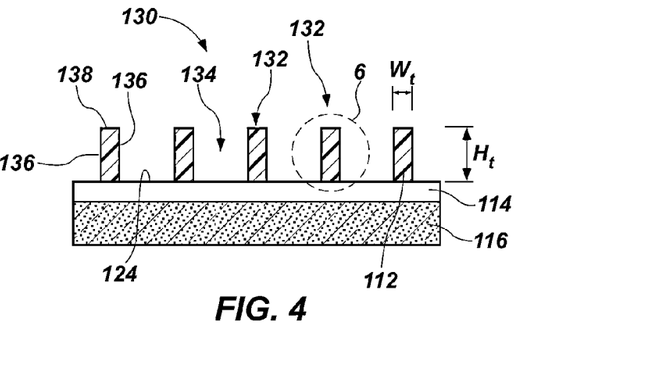
FIG. 4 is a cross-sectional elevational schematic illustration taken along line 4-4 of FIG. 3.

During a conventional trimming process, the initial features 120 may be exposed to an etchant, referred to herein as a "trimming chemistry." The trimming chemistry may be used to remove material laterally and vertically from the initial features 120 at sidewalls 126 and a top surface 128, respectively, to form, as illustrated in FIGS. 3 and 4, a trimmed pattern 130 of trimmed features 132 (also referred to herein as a "pattern of trimmed features"). In embodiments in which the initial features 120 are elongate features, the trimmed features 132 may also be elongate features, but with a narrower width (i.e., a smaller lateral dimension). The trimmed features 132 may be spaced from one another by enlarged trenches 134 exposing more of the upper surface 124 of the base material 114 than was exposed by the trenches 122 prior to the trimming process.

Figure 5:
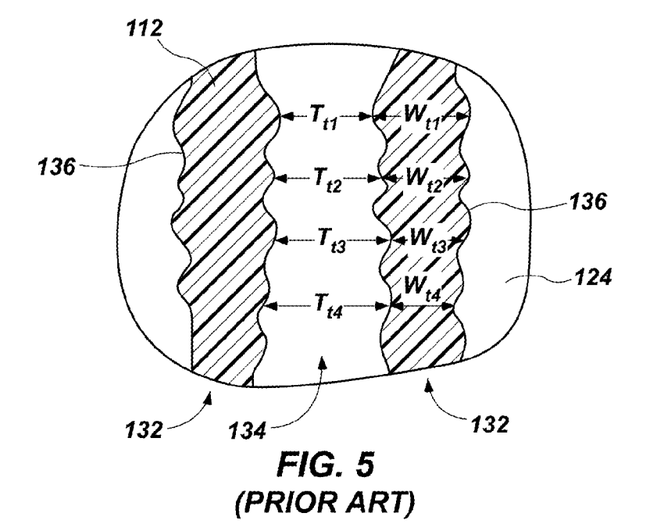
FIG. 5 is a top plan schematic illustration of segment 5 of FIG. 3, shown in enlargement, according to a conventional semiconductor device structure fabrication process.

Each of the trimmed features 132 defines a trimmed width $W_t$ and a trimmed height $H_t$. Theoretically, the trimmed width $W_t$ may correspond to a desired critical dimension, and each of the trimmed features 132 includes trimmed sidewalls 136 that define a smooth, vertical, elevational profile terminating at a 90° angle with a planarized, trimmed top surface 138. In actual practice, however, conventional trimming chemistries and processes often lead to formation of trimmed features 132 having rough (non-uniform) trimmed sidewalls 136 that are not straight and vertical and that do not meet a planarized top surface 138 at a 90° angle. As illustrated in FIG. 5, the trimmed sidewalls 136 may include peaks and valleys that contribute to a nonuniform feature width roughness (e.g., line width roughness (LWR)) and nonuniform space width roughness (SWR). Thus, at various points along a length of a trimmed feature 132, the trimmed width $W_t$ may vary; hence, as illustrated in FIG. 5, trimmed widths $W_{t1}$, $W_{t2}$, $W_{t3}$, and $W_{t4}$ are not uniform. Likewise, at various points along a length of the enlarged trenches 134, a trench width (e.g., $T_{t1}$, $T_{t2}$, $T_{t3}$, and $T_{t4}$) varies.

As illustrated in FIGS. 6A through 6J, conventional trimming chemistries and processes may also lead to formation of trimmed features 132A-132E and trimmed patterns 130E-130J having undesirable cross-sectional profiles that exhibit one or more defects. Conventional trimming chemistries include, for example, sulfur dioxide alone (i.e., $SO_2$, which may produce trimmed pattern 130F of FIG. 6F), sulfur dioxide and oxygen (i.e., $SO_2$ and $O_2$, which may produce trimmed pattern 130G of FIG. 6G), oxygen and a halogen-based compound without sulfur dioxide (e.g., $Cl_2$ and $O_2$, which may produce trimmed pattern 130H of FIG. 6H), oxygen with a halogen-based compound and an organohalogen compound, but without sulfur dioxide (e.g., $Cl_2$, $O_2$, $CF_4$, and $CH_2O_2$, which may produce trimmed pattern 130I of FIG. 6I), or oxygen with an organohalogen compound and without sulfur dioxide (e.g., $CF_4$ and $O_2$, which may produce trimmed pattern 130J of FIG. 6J). As such, conventional trimming chemistries may produce trimmed features having slanted profiles (e.g., trimmed features 132A, 132E and trimmed patterns 130F, 130J), sloped sidewalls (e.g., trimmed features 132A, 132B and trimmed pattern 130I), top coating material 140 overhang regions 142 (e.g., trimmed feature 132C), line collapse or wobbling (e.g., trimmed feature 132D and trimmed pattern 130J), top tapering (e.g., trimmed features 132A, 132E and trimmed patterns 130E-130I), bottom tapering (e.g., trimmed feature 132B and trimmed pattern 130I), and excessive height loss (e.g., trimmed feature 132E and trimmed patterns 130F, 130G). Each of the imperfections with regard to feature width roughness, space width roughness, trimmed feature profile, and feature height may lead to formation of errors in structures formed in the base material 114 when the trimmed pattern 130 is transferred to the base material 114. It is contemplated that avoiding such imperfections may present even more of a challenge as critical dimensions decrease.

DETAILED DESCRIPTION

Methods of forming a semiconductor device structure and sulfur dioxide etch chemistries are disclosed. The disclosed methods and chemistries utilize sulfur dioxide and a halogen-based compound, which enable formation of a pattern of trimmed features of a resist or other patterning material at a desired critical dimension while being less prone to high feature width roughness, high space width roughness, high feature height loss, and irregular cross-sectional profiles, such as profiles that are slanted, tapered, or include overhang regions. Consequently, the resulting pattern of trimmed features may be transferred to a base material with more reliability to pattern the base material with precision at even small dimensions.

As used herein, the term "substrate" means and includes a foundation material or construction upon which components, such as those within memory cells as well as other semiconductor device structures, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

As used herein, the term "base material" refers to a material that is to be patterned by transferring an overlying, defined pattern in a patterning material. The base material may comprise one or more of a hard mask material, a conductive material, a dielectric material, an antireflective coating material, or other known materials utilized in semiconductor device structures. In some instances, the material of a substrate of semiconductor material may, itself, comprise a base material.

As used herein, the term "halogen-based compound" refers to a chemical compound comprising a halogen (e.g., fluorine, chlorine, bromine) atom. For example, and without limitation, a halogen-based compound may include at least one of tetrafluoromethane ($CF_4$), octafluoropropane ($C_3F_8$), octafluorocyclobutane ($C_4F_8$), hexafluorobutadiene ($C_4F_6$), octafluorocyclopentene ($C_5F_8$), fluoroform ($CHF_3$), difluoromethane ($CH_2F_2$), sulfur hexafluoride ($SF_6$), nitrogen trifluoride ($NF_3$), chlorine trifluoride ($ClF_3$), hydrogen bromide (HBr), chlorine ($Cl_2$), boron trichloride ($BCl_3$), and trifluoroiodomethane ($CF_3I$).

As used herein, the terms "fluorine-based compound," "chlorine-based compound," "bromine-based compound," and "iodine-based compound" refer to a chemical compound comprising a fluorine (F) atom, a chlorine (Cl) atom, a bromine (Br) atom, and an iodine (I) atom, respectively. The terms are not mutually exclusive. For example, $CF_3I$ is within the definition of both the "fluorine-based compound" term and the "iodine-based compound" teen as used herein.

As used herein, the term "organohalogen compound" refers to a chemical compound comprising at least one carbon atom bonded to at least one halogen atom. For example, and without limitation, an organohalogen compound may include one or more of an organofluorine compound, an organochlorine compound, an organobromine compound, and an organoiodine compound. Again, these terms are not mutually exclusive.

As used herein, the term "trim" refers to removal of material from at least a vertically-oriented surface of the material being "trimmed." In this sense, a "vertically-oriented" surface is one that defines a plane essentially perpendicular to a plane defined by a primary surface of the substrate over which the material being trimmed is located.

As used herein, the term "top coating material" refers to a material of a composition formulated to protect a photoresist material in photolithography processes. A top coating material may be formulated to inhibit leaching of acid or base from the photoresist. For example, and without limitation, a top coating material may include a polymer material, such as, e.g., a perfluoro alkyl polyether, a perfluoro alkyl amine, or other resist top coating material known in the art.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, structures, regions, integers, stages, operations, elements, materials, components, and/or groups, but do not preclude the presence or addition of one or more other features, structures, regions, integers, stages, operations, elements, materials, components, and/or groups thereof.

As used herein, the term "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, feature, structure, region, segment, or fabrication stage, but are merely idealized representations that are employed to describe embodiments of the present disclosure.

Embodiments are described herein with reference to the accompanying drawing figures. Variations from the shapes of the structures depicted in the figures as a result, for example, of manufacturing techniques and/or tolerances, are to be expected. Thus, embodiments described herein are not to be construed as being limited to the particular shapes or regions as illustrated but include deviations in shapes that result, for example, from manufacturing. For example, a region illustrated or described as box shaped may have rough and/or nonlinear structures. Moreover, sharp angles that are illustrated may be rounded. Thus, the regions illustrated in the figures are schematic in nature and their shapes are not intended to illustrate the precise shape of a region and do not limit the scope of the present claims.

The following description provides specific details, such as material types and processing conditions, in order to provide a thorough description of some embodiments of the disclosed devices and methods. However, a person of ordinary skill in the art will understand that the embodiments of the methods may be practiced without employing these specific details. Indeed, the embodiments of the methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and structures necessary to understand embodiments of the present devices and methods are described herein.

Unless the context indicates otherwise, the materials described herein may be formed by any suitable technique including, but not limited to, spin coating, knife coating, dip coating, blanket coating, chemical vapor deposition ("CVD"), atomic layer deposition ("ALD"), plasma enhanced ALD, and physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, abrasive planarization, and other methods.

Reference will now be made to the drawings, where like numerals refer to like components throughout. The drawings are not necessarily drawn to scale.

The methods disclosed herein may be used to form semiconductor device structures. As nonlimiting examples, the methods may be used to pattern hard masks for semiconductor device fabrication or to form conductive contacts, conductive interconnects, transistors, and memory devices, including, for example, in dynamic random access memory (DRAM) cells, non-volatile memory cells, and NAND flash memory.

Figure 7:
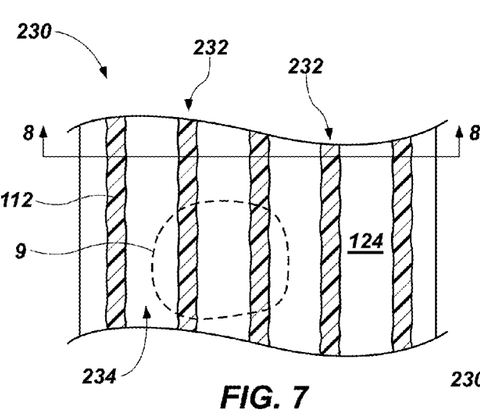
FIG. 7 is a top plan schematic illustration of a plurality of trimmed pattern features defining a trimmed pattern during a stage of fabrication of a semiconductor device structure according to an embodiment of the present disclosure, the illustrated stage following that illustrated in FIG. 1.
Figure 8:
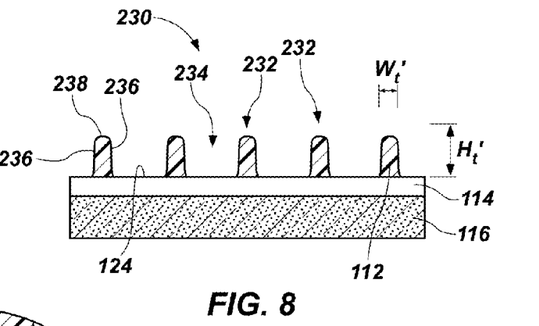
FIG. 8 is a cross-sectional elevational illustration taken along line 8-8 of FIG. 7.

With reference to FIGS. 7 and 8, a trimmed pattern 230 may be formed by exposing a patterning material, such as an exposed and developed patterning material 112 comprising features to be trimmed before being transferred to base material 114, to a trimming chemistry. Prior to exposing the patterning material 112 to the trimming chemistry, the patterning material 112 may be formed over a base material, e.g., the base material 114, which may be supported by a substrate, e.g., the substrate 116. The patterning material 112 may be patterned, e.g., by a photolithography process, to form an initial pattern, such as the initial pattern 118 (FIGS. 1 and 2). Patterning the patterning material 112 may include selectively removing regions of the patterning material 112 to define the initial features 120 (FIG. 1) (e.g., initial resist features, such as elongate resist features) separated from one another by the trenches 122 (FIG. 2). The upper surface 124 of the base material 114 may be exposed through the trenches 122 (FIG. 2).

Exposing the initial pattern 118 (FIGS. 1 and 2) of the initial features 120 to the trimming chemistry may be used to broaden the trenches 122 (FIG. 2) by at least removing material from the sidewalls 126 of the initial features 120 (e.g., laterally etching the initial features 120) to form a trimmed pattern 230 of trimmed features 232 (e.g., trimmed resist features, such as trimmed elongate resist features) spaced from one another by enlarged trenches 234 and having trimmed sidewalls 236 and a trimmed top surface 238. The trimmed features 232 define a trimmed width $W_t'$ and a trimmed height $H_t'$. Further, the trimmed features 232 define a cross-sectional profile (i.e., a side view through the width of the feature), e.g., the profiles illustrated in FIG. 8. The cross-sectional profile of the trimmed features 232 may be less slanted, may be less prone to line collapse or wobbling, may include more vertically aligned trimmed sidewalls 236, and may include a less tapered trimmed top surface 238, without excessive height loss, as compared to the elevational profiles of trimmed features 132 formed using conventional trimming chemistries, e.g., trimmed features 132A-132E (FIGS. 6A through 6E).

Figure 9:
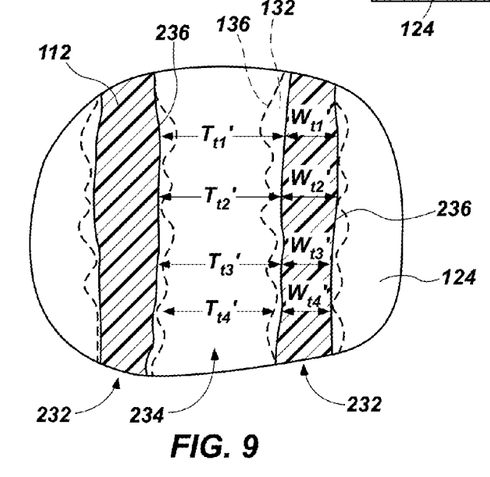
FIG. 9 is a top plan schematic illustration of segment 9 from FIG. 7, shown in enlargement, according to an embodiment of the present disclosure.

With reference to FIG. 9, the resulting trimmed features 232 may include trimmed sidewalls 236 exhibiting less feature width roughness (e.g., less line width roughness) than that of the trimmed sidewalls 136 of the trimmed features 132 farmed using a conventional trimming chemistry. Therefore, for example, feature widths taken along various points along the trimmed features 232, e.g., feature widths $W_{t1}'$, $W_{t2}'$, $W_{t3}'$, and $W_{t4}'$, as well as trench widths taken along various points along the enlarged trenches 234, e.g., trench widths $T_{t1}'$, $T_{t2}'$, $T_{t3}'$, and $T_{t4}'$, may vary less, on average, than the feature widths taken along various points along the trimmed features 132 (FIG. 5), e.g., feature widths $W_{t1}$, $W_{t2}$, $W_{t3}$, and $W_{t4}$, vary from one another and the trench widths taken along various points along the large trenches 134 (FIG. 5), e.g., trench widths $T_{t1}$, $T_{t2}$, $T_{t3}$, and $T_{t4}$, vary from one another, respectively.

The trimmed pattern 230 of trimmed features 232 may be transferred to the base material 114 by selectively removing portions of the base material 114 exposed in the enlarged trenches 234. Methods for removing the base material 114, e.g., a hardmask material, are known in the art and therefore are not described in detail.

The trimmed features 232 may be formed using the trimming chemistry in a dry etching process. For example, the patterning material 112 may be exposed to the trimming chemistry within an etching chamber, such as an etching chamber configured to provide an RF source power via transformer coupled plasma ("TCP"), inductively coupled plasma ("ICP"), an electron cyclotron resonance ("ECR") plasma source, or capacitively coupled plasma with high frequency RF power. Thus, the trimming chemistry may be in the fora of a plasma during the trimming process, wherein the plasma includes the sulfur dioxide and a halogen-based material.

The trimming chemistry may be introduced into the chamber and may be used to form the plasma that acts upon the patterning material 112 to trim the initial features 120 and to widen the trenches 122 to form the enlarged trenches 234. Source power or top power (e.g., power from a TCP source), also referred to herein as "RF" power, may be applied at a level of about 150 W to about 1000 W, e.g., about 380 W. Selecting the appropriate top power level may depend upon the composition of the trimming chemistry, the equipment used, and the patterning material 112 to be exposed.

Accordingly, disclosed is a method of forming a semiconductor device structure. The method comprises forming a resist material over a base material. Portions of the resist material are selectively removed to define trenches in the resist material. The resist material is exposed to a plasma to widen the trenches. The plasma comprises sulfur dioxide and at least one of a fluorine-based compound, a chlorine-based compound, and a bromine-based compound.

Substantial bias power may not be applied during the trimming process, such that the bias voltage does not exceed about 10 V. In other embodiments, bias power may be applied at, for example, below about 50 V. As discussed below, selecting the appropriate bias power level may depend, at least in part, on the composition of the patterning material 112 to be exposed as well as whether the trim chemistry is employed to both pattern and trim features in the patterning material as described below The patterning material 112 over the substrate 116 may be exposed to the trimming chemistry for a duration of between about 5 seconds and about 50 seconds, e.g., about 25 seconds. Again, the exposure time (also referred to herein as the "throughput time") selected may depend at least in part on the patterning material 112 to be exposed, the composition of the trimming chemistry, and the desired critical dimension and cross-sectional profile of the resulting trimmed features 232.

The chamber temperature may be maintained at about 25° C. to about 70° C., e.g., about 50° C. In other embodiments, the chamber temperature may be adjusted during the process. Pressure within the chamber may be maintained at about 2 mTorr to about 100 mTorr, e.g., about 8 mTorr. The pressure may be stabilized within the chamber prior to striking RF power to generate the plasma and prior to beginning the trimming. The pressure may be maintained throughout the trimming process. However, in other embodiments, the pressure may be adjusted during the process. The pressure conditions may be selected depending, at least in part, on the composition of the trimming chemistry, the composition of the patterning material 112 to be exposed, and the desired critical dimension and elevational profile of the resulting trimmed features 232.

Thus, the duration time, the chamber pressure, the source power, and the bias power (e.g., bottom) may be selected to tune the trimming process to form the trimmed features 232 from the patterning material 112 to a desired critical dimension and a desired elevational profile while still achieving low feature width roughness and space width roughness. For example, a "low" feature width roughness may be a feature width roughness of less than about 40 Å with a three sigma distribution, e.g., less than about 30 Å with a three sigma distribution. The trimming process conditions and the composition of the trimming chemistry may be selected based at least in part on the composition of the patterning material 112 to be trimmed. For example, the trimming chemistries discussed below may be formulated to trim a 193 nm resist material. The same trimming chemistries, with possible adjustments as to relative concentrations and process conditions, may alternatively be used to trim a 248 nm resist, a 157 nm resist, or both. The 193 nm resist material, the 248 nm resist material, or the 157 nm resist material may be a conventional photoresist material, such as a conventional positive tone or negative tone photoresist material.

The trimming chemistry to which the initial pattern 118 of the initial features 120 (FIG. 1) is exposed to form the trimmed pattern 230 (FIG. 7) of the trimmed features 232 may be a chemistry comprising sulfur dioxide and a halogen-based compound. For example, and without limitation, the trimming chemistry may include sulfur dioxide and at least one of a halogen-based compound (e.g., a fluorine-based compound, a chlorine-based compound, a bromine-based compound), such as an organohalogen compound. More specifically, for example and without limitation, the trimming chemistry may include sulfur dioxide and at least one of $CF_4$, $C_3F_8$, $C_4F_8$, $C_4F_6$, $CHF_3$, $CH_2F_2$, $SF_6$, $NF_3$, $ClF_3$, $HBr$, $Cl_2$, $BCl_3$, and $CF_3I$.

Accordingly, disclosed is a sulfur dioxide etch chemistry comprising a plasma. The plasma comprises sulfur dioxide and a halogen-based compound.

Without being limited to any one theory, it is contemplated that the combination of the sulfur dioxide and the halogen-based compound within the same trimming chemistry provides the benefits of low feature width roughness and space width roughness while enabling achievement of a desired critical dimension without excessive feature height loss and without excessive irregularities in the elevational profile. It is contemplated that, in the trimming chemistry, several reactions may take place, such as etching of resist material, halogenization of resist components, sulfurization (e.g., cross-linking) of resist components, and deposition of polymers. The halogen within the trimming chemistry may halogenize the resist material (i.e., enable a chemical reaction between the halogen of the trimming chemistry and a component of the patterning material 112, e.g., carbon), resulting in different chemical and mechanical properties of the resist material (e.g., the patterning material 112). Such property change may depend upon the halogen species in the trimming chemistry and the polymerizing (e.g., cross-linking) tendency of the gases within the trimming chemistry. Sulfur dioxide ($SO_2$), on the other hand, contains both an aggressive etching component, i.e., oxygen (O), and a moderate depositing and cross-linking component, i.e., sulfur (S). The halogen species in the trimming chemistry (e.g., in the plasma) may also affect the degree of disassociation of the sulfur dioxide. Fluorine radicals may be the most aggressive halogen species in this regard, i.e., in breaking of bonds between sulfur and oxygen in the sulfur dioxide. Because there may be an intrinsic bias voltage (which may be less than about 8 V) in a plasma trimming chemistry, even when using a 0 W bias power setting during the trimming process, it is contemplated that the sulfurization (i.e., chemical reaction between sulfur of the trimming chemistry and a component of the patterning material 112, e.g., carbon) and halogenization take place on the top surface 128 (FIG. 2) of the initial features 120 (FIG. 2), where there is ion bombardment because of the intrinsic bias voltage. This bias voltage may enhance the penetration depth of the halogen or sulfur species into the resist (e.g., the patterning material 112). However, on the sidewalls 126 (FIG. 2) of the initial features 120 (FIG. 2), there may be no ion bombardment. Therefore, compared to the top surface 128 (FIG. 2), there may be less halogenization and sulfurization on the sidewalls 126 (FIG. 2) but more deposition (e.g., when the gases of the trimming chemistry are formulated to enable polymerization). As such, a larger remaining resist height (e.g., greater final trimmed height $H_t'$ (FIG. 8)) may be attributable to factors, including, (1) that halogenized or sulfurized resist material (e.g., patterning material 112) may have more physical strength than non-halogenized and non-sulfurized resist material and may, therefore, be able to better withstand the heat of the plasma, resulting in less melt-down of the resist material, and (2) halogenized or sulfurized resist material (e.g., patterning material 112) may be more etch-resistant than non-halogenized and non-sulfurized resist material, such that a topside trim rate (e.g., vertical etch rate) may be reduced more than a sidewall trim rate (e.g., horizontal etch rate) is reduced due to the occurrence of more halogenization, sulfurization, or both on the top surface 128 (FIG. 2) than on the sidewalls 126 (FIG. 2) of the initial features 120 (FIG. 2). Additionally, post trim feature width roughness (e.g., line width roughness) may be impacted by factors, including, (1) the feature width roughness of the initial features 120 (FIG. 2), i.e., the starting feature width roughness; (2) the trimming chemistry's etch selectivity to various components of the patterning material 112 during the trimming process; (3) the composition of the patterning material 112, including, for example, how components of the patterning material 112 are connected to one another; and (4) the mechanical strength of the patterning material 112 under the heat of a plasma trimming chemistry, wherein a patterning material 112 with a relatively higher mechanical strength may be less prone to wobbling than a patterning material 112 with a relatively lower mechanical strength. Both halogenization and sulfurization may enhance mechanical strength and may improve the evenness of the patterning material, which may result in less feature width roughness in the trimmed features 132 than the feature width roughness of conventionally trimmed features. Therefore, the final trimmed height $H_t'$ and feature width roughness may be tuned by tailoring the composition (e.g., gaseous species) within the trimming chemistry and the flow rates of the components relative to that of the sulfur dioxide.

In some embodiments, the trimming chemistry may be formulated to provide trimmed features 232 exhibiting low feature width roughness, low space width roughness, and elevational profiles having few imperfections while also having little feature height loss. Such trimming chemistries so formulated may include, for example, sulfur dioxide and a non-polymerizing gas at least one component consisting of two elements, one of the two elements being fluorine, and the other element being, e.g., carbon, nitrogen, sulfur, or chlorine. These "type I trimming chemistries" may include, for example, $CF_4$, $NF_3$, $SF_6$, $C_3F_8$, ClF, and $ClF_3$. Such type I trimming chemistries may be useful for trimming resist materials or carbon-based materials to post-trim line critical dimensions that are very small (e.g., fewer than 25 nm) and the trimmed features need to be tall enough for subsequent processing acts. Type I trimming chemistries may yield a single-side lateral trim rate (e.g., lateral etch rate) that is about 40 percent to about 70 percent that of a vertical trim rate (e.g., vertical etch rate). For example, an initial feature 120 (FIG. 2) of a top-coated (with top coating material 140) resist patterning material 112, having an initial height $H_i$ of about 900 Å, an initial width $W_i$ of about 460 Å, and an initial feature width roughness of about 55 Å with a three sigma distribution, exposed to a type I trimming chemistry comprising $SO_2$ and $NF_3$ to reduce (e.g., shrink) the width of the initial feature 120 to a final trimmed width $W_t'$ of about 190 Å, may form a trimmed feature 232 (FIG. 8) having a final trimmed height $H_t'$ of about 700 Å (e.g., about 730 Å) and a feature width roughness of about 28 Å. As another example, exposing an initial feature 120 (FIG. 2) of a top-coated (with top coating material 140) resist patterning material 112, having an initial height $H_i$ of about 900 Å, an initial width $W_i$ of about 460 Å, and an initial feature width roughness of about 55 Å with a three sigma distribution, exposed to a type I trimming chemistry comprising $SO_2$ and $CF_4$ to reduce (e.g., shrink) the width of the initial feature 120 to a final trimmed width $W_t'$ of about 190 Å, may form a trimmed feature 232 (FIG. 8) having a final trimmed height $H_t'$ of about 700 Å (e.g., about 670 Å) and a feature width roughness of about 28 Å.

In some embodiments, the trimming chemistry may be formulated to provide trimmed features 232 exhibiting low feature width roughness and low space width roughness, though with more feature height loss than features formed using the type I trimming chemistries. Such trimming chemistries so formulated may include, for example, sulfur dioxide and one or more relatively polymerizing gases with at least one of $CHF_3$, $CH_2F_2$, $C_4F_8$, $C_4F_6$, and $C_5F_8$ (referred to herein as a "type II trimming chemistry"). The organohalogen compounds within the type II category may include at least one of one or more hydrogen atoms (e.g., as in $CHF_3$ and $CH_2F_2$), double- or triple-bonded carbon atoms (e.g., in some isomers of $C_4F_8$, $C_4F_6$, or $C_5F_8$), and a carbon ring (e.g., in some isomers of $C_4F_8$, $C_4F_6$, or $C_5F_8$). Such type II trimming chemistries may have slower lateral etch rates than those of type I trimming chemistries. They may be used in trimming processes in which trimmed features 232 of shorter resist heights than those formed using type I trimming chemistries are needed for or do not negatively impact subsequent processing acts. Type II trimming chemistries may also be used if formation of fluorocarbon polymers on surfaces of the patterning material 112 are desired or beneficial. For example, an initial feature 120 (FIG. 2) of a top-coated (with top coating material 140) resist patterning material 112, having an initial height $H_i$ of about 900 Å, an initial width $W_i$ of about 460 Å, and an initial feature width roughness of about 55 Å with a three sigma distribution, exposed to a type II trimming chemistry comprising $SO_2$ and $CH_2F_2$ to reduce (e.g., shrink) the width of the initial feature 120 to a final trimmed width $W_t'$ of about 190 Å, may form a trimmed feature 232 (FIG. 8) having a final trimmed height $H_t'$ of less than about 520 Å and a feature width roughness of about 29 Å.

In other embodiments, the trimming chemistry may be formulated to provide trimmed features 232 exhibiting low feature width roughness and low space width roughness, though with more feature height loss than features formed using type I and type II trimming chemistries. Such trimming chemistries so formulated may include a halogen other than fluorine (i.e., a "non-fluorine halogen"), e.g., chlorine, bromine, or iodine. These "type III trimming chemistries" may include, for example, sulfur dioxide and at least one of $Cl_2$, HBr, $BCl_3$, and $CF_3I$. Type III trimming chemistries may achieve superior feature width roughness and superior etch selectively over DARC (dielectric antireflective coating), compared to other types of trimming chemistries. Type III trimming chemistries may also provide a relatively larger process window in which to achieve low feature width roughness or space width roughness. Also, type III trimming chemistries may exhibit a vertical etch rate that is at least about three times greater than a lateral etch rate. For example, an initial feature 120 (FIG. 2) of a top-coated (with top coating material 140) resist patterning material 112, having an initial height $H_i$ of about 900 Å, an initial width $W_i$ of about 460 Å, and an initial feature width roughness of about 55 Å with a three sigma distribution, exposed to a type III trimming chemistry comprising $SO_2$ and $Cl_2$ to reduce (e.g., shrink) the width of the initial feature 120 to a final trimmed width $W_t'$ of about 190 Å, may form a trimmed feature 232 (FIG. 8) having a final trimmed height $H_t'$ of less than about 570 Å and a feature width roughness of about 27 to about 28 Å (e.g., about 27.5 Å).

Figure 10:
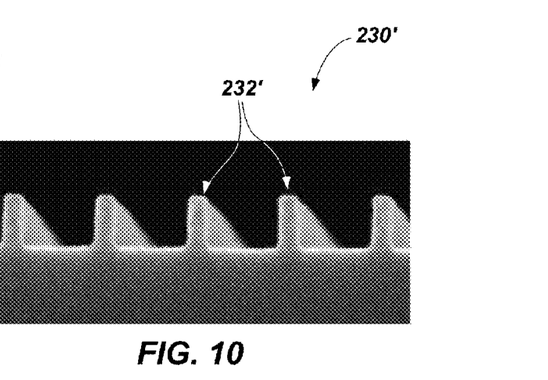
FIG. 10 is a photomicrograph of a plurality of trimmed pattern features defining a trimmed pattern during a stage of fabrication of a semiconductor device structure according to an embodiment of the present disclosure.

FIG. 10 depicts a photomicrograph of resulting trimmed features 232' defining a trimmed pattern 230' resulting from exposing a 193 nm photoresist material to a type I trimming chemistry. As shown, the trimmed features 232' have more remaining resist height (as compared to, e.g., FIGS. 6F and 6G), less top tapering (as compared to, e.g., FIGS. 6F-6I), less bottom tapering (as compared to, e.g., FIG. 6I), a more vertically aligned cross-sectional profile (as compared to, e.g., FIG. 6J), and substantially no slanting or wobbling (as compared to, e.g., FIG. 6J), at a small lateral dimension (which may be smaller than that of, e.g., FIG. 6I). For example, exposing an initial feature 120 (FIG. 2) of a top-coated (with top coating material 140) resist patterning material 112, having an initial height $H_i$ of about 900 Å, an initial width $W_i$ of about 460 Å, and an initial feature width roughness of about 55 Å with a three sigma distribution, to conventional trimming chemistries may form trimmed features having higher resist height loss, higher feature width roughness, or both compared to trimmed features 232 (FIG. 8) formed using trimming chemistries disclosed herein (e.g., the aforementioned example type I trimming chemistry comprising $SO_2$ and $NF_3$, the aforementioned example type I trimming chemistry comprising $SO_2$ and $CF_4$, the aforementioned example type II trimming chemistry comprising $SO_2$ and $CH_2F_2$, and the aforementioned example type III trimming chemistry comprising $SO_2$ and $Cl_2$). For example, exposing such initial feature to a conventional trimming chemistry of $Cl_2$ and $O_2$ may form a trimmed feature having more than 340 Å in height loss with a final feature width roughness of about 28.5 Å; exposing such initial feature to a conventional trimming chemistry of $Cl_2$, $O_2$, $CF_4$, and $CH_2F_2$ may form a trimmed feature having about 260 Å of height loss with a final feature width roughness of about 30.0 Å; exposing such initial feature to a conventional trimming chemistry of $CF_4$ and $O_2$ may form a trimmed feature having about 170 Å of height loss with a final feature width roughness of about 34.0 Å; exposing such initial feature to a conventional trimming chemistry of $Cl_2$, HBr, and $O_2$ may form a trimmed feature having more than about 380 Å of height loss with a final feature width roughness of about 28.5 Å; exposing such initial feature to a conventional trimming chemistry of $SO_2$ alone may form a trimmed feature having more than about 450 Å of height loss with a final feature width roughness of about 29.0 Å; and exposing such initial feature to a conventional trimming chemistry of $SO_2$ and $O_2$ may form a trimmed feature having more than about 500 Å of height loss with a final feature width roughness of about 29.5 Å.

Accordingly, also disclosed is method of forming a semiconductor device structure, the method comprising patterning a photoresist material to form resist features. The resist features are exposed to an etchant comprising sulfur dioxide and a halogen-based compound to reduce a width of each the resist features.

The concentration of components within the trimming chemistry may be described in terms of relative flow rates or, alternatively, in terms of parts. The trimming chemistry may include about 5 sccm to about 500 sccm of $SO_2$, e.g., about 30 sccm to about 300 sccm $SO_2$, while the halogen-based compound may be present at a range of, for example, about 0.1 parts (e.g., 0.1 sccm) to about 10 parts (e.g., 10 sccm) of the halogen-based compound per about 1 part (e.g., 1 sccm) of the $SO_2$. For example, without limitation, the trimming chemistry may comprise, for every 1 part of $SO_2$, at least one of about 0.2 parts to about 10 parts $CF_4$, about 0.2 parts to about 10 parts $SF_6$, about 0.2 parts to about 10 parts $NF_3$, about 0.2 parts to about 5 parts $ClF_3$, about 0.2 parts to about 10 parts $Cl_2$, about 0.1 parts to about 5 parts $CHF_3$, and about 0.1 parts to about 2 parts $CH_2F_2$. In the foregoing, the "parts" may be volumetric measurements, such as, for example, a volumetric flow rate (e.g., "sccm") or volumes themselves (e.g., "cm$^3$," or "L" (at chamber operating pressure and temperature)).

More particular examples of trimming chemistries, wherein compositions listed are in terms of flow rates of each component, are as follows:

Type I Trimming Chemistry Examples
(1) $SO_2$ at about 50 sccm, $CF_4$ at about 100 sccm
(2) $SO_2$ at about 50 sccm, $CF_4$ at about 120 sccm
(3) $SO_2$ at about 30 sccm, $CF_4$ at about 90 sccm, and $O_2$ at about 5 sccm
(4) $SO_2$ at about 30 sccm, $CF_4$ at about 150 sccm, and $O_2$ at about 5 sccm
(5) $SO_2$ at about 50 sccm, $SF_6$ at about 50 sccm
(6) $SO_2$ at about 50 sccm, $SF_6$ at about 100 sccm
(7) $SO_2$ at about 50 sccm, $SF_6$ at about 120 sccm
(8) $SO_2$ at about 50 sccm, $NF_3$ at about 100 sccm
(9) $SO_2$ at about 50 sccm, $NF_3$ at about 120 sccm
Type II Trimming Chemistry Examples
(10) $SO_2$ at about 50 sccm, $CH_2F_2$ at about 20 sccm (11) $SO_2$ at about 70 sccm, $CH_2F_2$ at about 50 sccm Type III Trimming Chemistry Example (12) $SO_2$ at about 60 sccm, $Cl_2$ at about 80 sccm The trimming chemistries above may be utilized in a trimming process at conditions of about 25 seconds throughput time, about 8 mTorr chamber pressure, about 380 W source RF power, about 0 V bias RF power, and about 50° C. electrostatic chuck (ESC) temperature, wherein the structure subjected to the trimming chemistry may be supported by the ESC.

Each of the foregoing trimming chemistry examples may additionally include, where not already listed, one or more additive gases such as, for example, argon (Ar), helium (He), nitrogen ($N_2$), and oxygen ($O_2$). Inert additive gases, such as Ar and He, may be included in the trimming chemistry to maintain a proper chamber pressure or to achieve certain etch uniformity. Reactive additive gases, such as $N_2$ and $O_2$, may be included in the trimming chemistry to increase the rate of material removal (e.g., the etch rate). However, selecting an amount of such reactive additive gases may be dependent upon tuning the trimming chemistry to achieve a desired elevational profile and feature height. When included, the additive gases may be included in the trimming chemistry in a ratio of about 1 part (e.g., about 1 sccm) for every about 0.1 part to about 15 parts (e.g., about 0.1 sccm to about 15 sccm) $SO_2$.

Exposing initial features 120 (FIG. 1) of a 193 nm photoresist material with a top coating material 140 thereon, the initial features 120 exhibiting initial widths $W_i$ of approximately 580 Å, initial heights $H_i$ of about 980 Å, and an initial feature width roughness of about 55 Å with a three sigma distribution, to one of the type I trimming chemistries at the conditions discussed above, the resulting trimmed features 232 may have the cross-sectional profile of the trimmed features 232 illustrated in FIG. 8 and may be photomicrographed as shown in FIG. 10. The trimmed features 232 may have a feature width roughness (e.g., a line width roughness) of about 28 Å with a three sigma distribution, a final trimmed height $H_t'$ of about 600 Å to about 800 Å (e.g., about 750 Å, using a type I trimming chemistry including $SO_2$ and $CF_4$, or about 600 Å, using a type I trimming chemistry including $SO_2$ and $CH_2F_2$), and a final trimmed width $W_t'$ of less than about 400 Å (e.g., about 360 Å). In such embodiments, therefore, the desired critical dimension (CD) may be equal to the resulting trimmed width $W_t'$(e.g., about 36 nm).

The trimmed feature 232 may be achieved using the trimming chemistry to remove material laterally from the resist material at a rate (e.g., at a lateral etch rate) of about 4 Å/s to about 7 Å/s (e.g., about 6 Å/s) and to remove material vertically from the resist material at a rate (e.g., a vertical etch rate) of about 1.8 times faster than the lateral material removal rate, i.e., about 7.2 Å/s to about 12.6 Å/s (e.g., about 10.8 Å/s).

Generally, a trimming chemistry formulated to yield a high trim rate ratio (i.e., the ratio of a lateral material removal rate to a vertical material removal rate) may be desirable, so as to achieve minimized reduction of the height of the patterning material 112, when removing material from the initial features 120 to form the trimmed features 232. For example, a "high" trim rate ratio may be greater than about 0.5, e.g., about 0.55 (i.e., a trim rate ratio of about 1 Å/s of lateral etching to about 1.8 Å/s of vertical etching). The trim rate ratio may be increased by increasing the relative amount (e.g., flow rate) of the non-polymerizing fluorine-based gases (e.g., $CF_4$, $NF_3$, $SF_6$, $ClF_3$), by increasing amount of sulfur dioxide relative to the other active gases (e.g., polymerizing gases (e.g., $CH_2F_2$ and $C_4F_6$)), or by decreasing the amount of aggressive carbon-etching gases (e.g., $O_2$) within the trimming chemistry relative to the other active components (e.g., the halogen-based compound or other etchant compounds). However, conventional trimming chemistries comprising a high concentration of sulfur dioxide or of sulfur dioxide and oxygen, without a halogen-based compound, often lead to extensive vertical material removal and tapering in the resulting trimmed features (e.g., trimmed features 132E (FIG. 6E) and trimmed patterns 130F (FIG. 6F) and 130G (FIG. 6G)). Accordingly, the ratio of sulfur dioxide to the halogen-based compound and other active compounds may be tailored to achieve a high trim rate ratio without excessive height loss and elevational profile tapering.

Without limitation, it is theorized that the inclusion of a halogen compound with the sulfur dioxide may enable halogenations and sulfurization (or cross-linking) of the resist or carbon material within the patterning material 112. Such halogenization (e.g., fluorination from $CF_4$, $NF_3$, $SF_6$, or $ClF_3$) and cross-linking may strengthen the patterning material 112 and may enhance its etch resistance, particularly on the top surface 128 (FIG. 2) of the initial features 120 (FIG. 2). Accordingly, a trimming chemistry comprising sulfur dioxide and at least one of, e.g., $CF_4$, $NF_3$, $SF_6$, $ClF_3$, $C_3F_8$, $C_4F_8$, $C_4F_6$, $CHF_3$, and $CH_2F_2$ may achieve a higher trim rate ratio than that achievable by a chemistry lacking a halogen compound. Therefore, for example, it is contemplated that a trimming chemistry comprising $SO_2$ and $CF_4$ may have a higher trim rate ratio compared to a trimming chemistry comprising $SO_2$ alone or one comprising $SO_2$ and $O_2$ without a organohalogen compound.

Accordingly, disclosed is a method of forming a semiconductor device structure, the method comprising forming a patterning material over a base material. At least a portion of the patterning material is removed to define a plurality of features in the patterning material. The patterning material is exposed to a chemistry comprising sulfur dioxide and a halogen-based compound to alter a lateral dimension of the features of the plurality of features and form a pattern of trimmed features.

The trim rate ratio may also be impacted by the presence or absence of bias power. For example, application of a bias power of more than about 50 W during the trimming process may increase a vertical material removal rate, thereby decreasing the trim rate ratio. In some embodiments, such as those in which a tall trimmed feature 232 (i.e., a trimmed feature 232 having a final trimmed height $H_t'$ of at least about 600 Å) is not vital to precise pattern transfer to the base material 114, a bias power may be applied during the trimming process.

Because application of bias power may promote material removal in the vertical direction, it is contemplated that the patterning material 112, before patterning or other material removal, may be exposed to the trimming chemistry in the presence of applied bias power to pattern the patterning material 112 to form the initial pattern, e.g., initial pattern 118 of initial features 120 (FIGS. 1 and 2). The bias power may then be substantially stopped and the initial pattern 118 of initial features 120 exposed to the trimming chemistry in the substantial absence of the bias power to trim the initial features 120 to form the trimmed features 132. Therefore, one chemistry may be used to both pattern and then to trim the patterning material 112, stopping the bias power therebetween. In such an embodiment, lowering the bias power during the trimming process may lower the vertical material removal rate while increasing the trim rate ratio.

Using the trimming chemistry during the application of bias power may also enable selective removal (e.g., trimming) of a material other than a conventional resist material. In such embodiments, the patterning material 112 may include, or consist of, a hardmask material. Accordingly the same trimming chemistry may be used to trim a photoresist material, in the substantial absence of a bias power, and to trim a hardmask material, in the presence of a bias power. Therefore, the methods and chemistries of the present disclosure are not limited to use with only resist materials.

The trimming chemistry, according to embodiments of the disclosure, may be formulated to accomplish isotropic etching during the trimming process. For example, the type I and type II trimming chemistries discussed above may be formulated for isotropic etching of a 193 nm resist material.

The trimming process may, optionally, further include a curing act prior to exposure of the initial features 120 to the trimming chemistry. For example, the initial features 120 of the patterning material 112 may be exposed to a curing chemistry comprising HBr for about 30 seconds to about 70 seconds prior to exposure to the trimming chemistry. The curing act may be used to smooth the initial features 120 and to densify the patterning material 112 within the initial features 120. The use of curing may further facilitate formation of trimmed features 232 exhibiting low feature width roughness.

The trimming chemistries comprising the sulfur dioxide and the halogen-based compound may selectively etch carbon-based material relative to oxide and nitride materials, e.g., when in the substantial absence of bias power. That is, the trimming chemistries may remove carbon-based material faster than they remove oxide and nitride materials when no substantial bias power is applied. Accordingly, the base material 114 may include a dielectric antireflective coating (DARC), such as, for example, silicon dioxide, silicon oxynitride, or combinations thereof. In such embodiments, the trimming process may trim the initial features 120 of the patterning material 112 to form the trimmed features 132 without substantially removing the base material 114.

The trimming chemistry may alternatively or additionally be formulated to enable selective removal (e.g., etching) of non-carbon-based materials with application of substantial bias power, such as, for example, a bottom-antireflective coating (BARC). The same trimming chemistry may be formulated to enable selective removal (e.g., etching or trimming) of oxide-containing or nitride-containing material from, for example, the base material 114, with the application of bias power, e.g., a bias power of less than about 50 V.

Figure 6A:
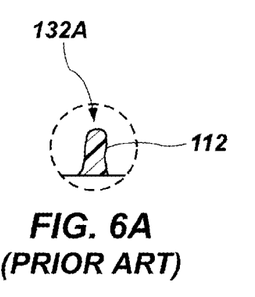
FIGS. 6A through 6E are cross-sectional elevational illustrations of segment 6 from FIG. 4, according to conventional semiconductor device structure fabrication processes.
Figure 6B:
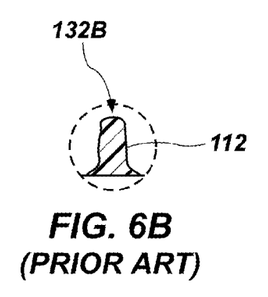
Figure 6C:
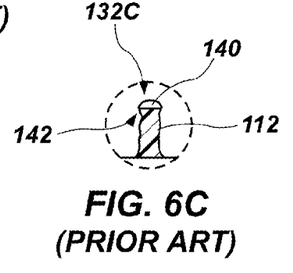
Figure 6D:
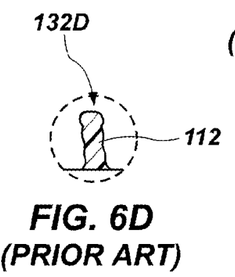
Figure 6E:
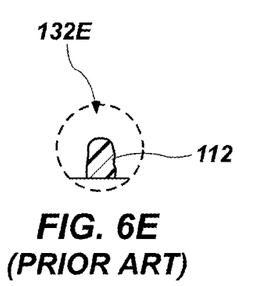
Figure 6F:
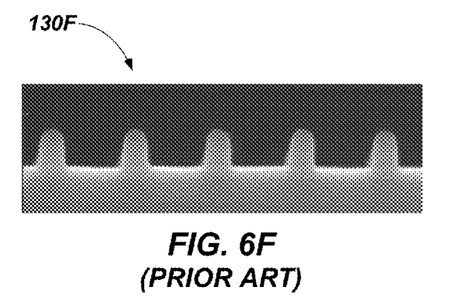
FIGS. 6F through 6J are photomicrographs of a plurality of trimmed pattern features defining trimmed patterns during a stage of fabrication of a semiconductor device structure according to conventional semiconductor device structure fabrication processes.
Figure 6G:
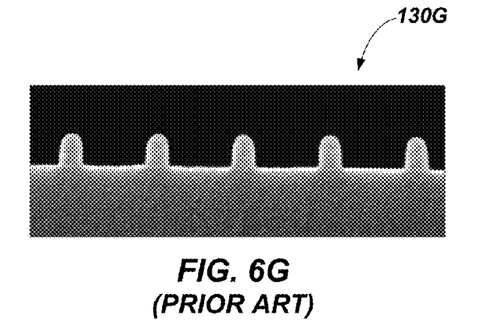
Figure 6H:
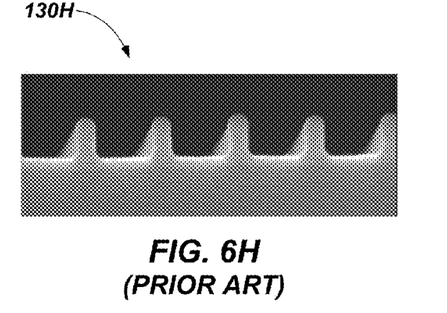
Figure 6I:
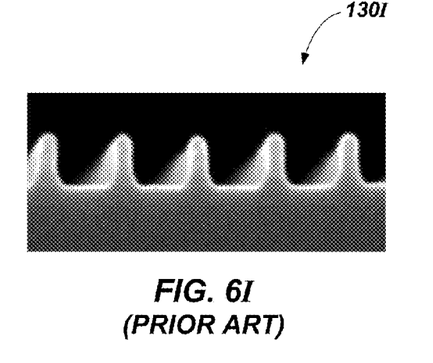
Figure 6J:
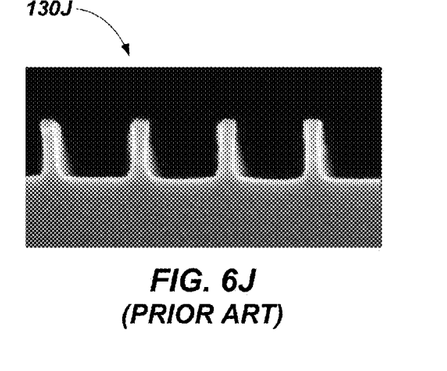

According to some conventional photolithography techniques used to pattern a resist material, a top coating material 140 (FIG. 6C) may be applied over a top surface of the resist material (e.g., over a top surface of the patterning material 112), prior to patterning the patterning material 112 to form the initial features 120 (FIG. 1). In such embodiments, the presence of the top coating material 140 (FIG. 6C) on the initial features 120 may lead to feature width roughness and an other-than-vertical profile after initial patterning or after trimming with a conventional trimming chemistry, such as a conventional trimming chemistry comprising $CF_4$ and $O_2$. Conventional trimming chemistries may remove resist material along the sidewalls 126 of the initial features 120 faster than the top coating material 140 is removed, leading to formation of an overhang region 142 (FIG. 6C). In embodiments of the present methods and chemistries, when used with initial features 120 including top coating material 140 thereon, the trimming chemistry may be tailored to substantially remove the top coating material 140 during the trimming process, which may enable formation of the trimmed features 132 with a vertical elevational profile and without an overhang region 142. Tuning the trimming chemistry may include selecting a relative amount of sulfur dioxide and halogen-based compound, such as $CF_4$, that removes as much of the top coating material 140 as needed to avoid formation of the overhang region 142 but not removing so much of the top coating material 140 and portions of the top surface 128 to form a tapered (e.g., rounded) trimmed top surface (e.g., as in FIGS. 6A and 6E). Increasing the amount (e.g., flow rate) of the sulfur dioxide relative to the halogen-based compound (e.g., $CF_4$) within the trimming chemistry may increase the rate at which the top coating material 140 is removed. On the other hand, increasing the amount (e.g., flow rate) of the halogen-based compound (e.g., $CF_4$) relative to the sulfur dioxide within the trimming chemistry may decrease the rate at which the top coating material 140 is removed. Accordingly, the composition of the trimming chemistry can be tailored to tune the resulting elevational profile of the trimmed features 232.

It is contemplated that if the cross-sectional profile of an initial feature 120 including a top coating material 140 is substantially vertical, the trimming chemistry according to embodiments of the present disclosure may be tailored to not substantially remove the top coating material 140 during the trimming process. In such embodiments, given the vertical cross-sectional profile of the initial feature 120, removing the top coating material 140 may not be necessary to achieve a vertical elevational profile in the trimmed feature 132.

Even in embodiments in which a top coating material 140 is not utilized, the trimming chemistries and methods of embodiments of the present disclosure may achieve formation of the trimmed features 232 at a desired critical dimension with low feature width roughness, with more vertical elevational profiles, and without excess height loss. Accordingly, the present methods and chemistries are configured and formulated, respectively, for use with both patterning material 112 alone and patterning material 112 over which a top coating material 140 has been formed.

Because the trimming chemistries, according to embodiments of the present disclosure, enable formation of trimmed features 232 at a desired critical dimension with low feature width roughness, low feature height loss, and with about vertical elevational profiles, the trimming chemistries are formulated for use in patterning processes used for fabricating semiconductor device structures at very small dimensions, e.g., at critical dimensions of less than about 25 nm. Accordingly, the trimming chemistries may be used as part of a pitch multiplication process (e.g., pitch doubling, pitch tripling), as illustrated in FIGS. 11 through 14. Pitch multiplication processes are used to form at least two features in a target material for each feature that may be formed in an overlying material, such as a patterning material, from an initial patterning process. Examples of various pitch multiplication processes are described in, for example, U.S. Pat. No. 7,709,390, issued May 4, 2010, and U.S. Pat. No. 7,989,307, issued Aug. 2, 2011.

Figure 11:
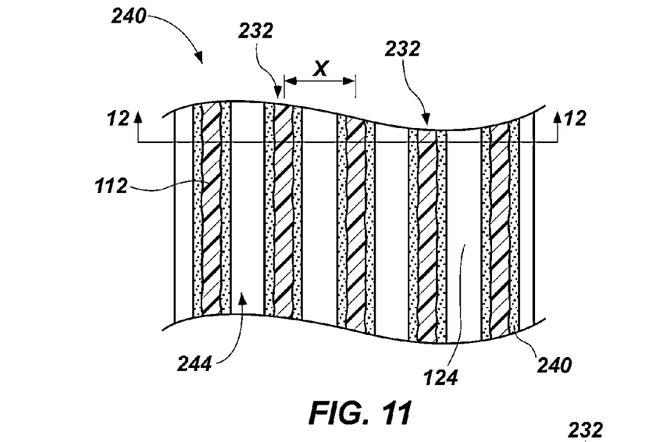
FIG. 11 is a top plan schematic illustration during a stage of fabrication of a semiconductor device structure according to an embodiment of the present disclosure, the illustrated stage following that illustrated in FIG. 7.
Figure 12:
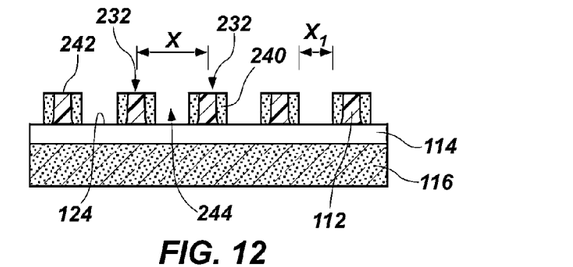
FIG. 12 is a cross-sectional elevational schematic illustration taken along line 12-12 of FIG. 11.

With reference to FIGS. 11 and 12, illustrated is a pitch multiplication process act following the fabrication process act illustrated in FIGS. 7 and 8. The trimmed features 232 may be formed to define a starting pitch, labeled in FIG. 11 as "X." A spacer material is formed over the trimmed features 232, and an upper surface thereof may be planarized to form spacers 240 between which are exposed planarized top surfaces 242 of the trimmed features 232. Neighboring spacers 240 define an opening 244 of width $X_1$.

Figure 13:
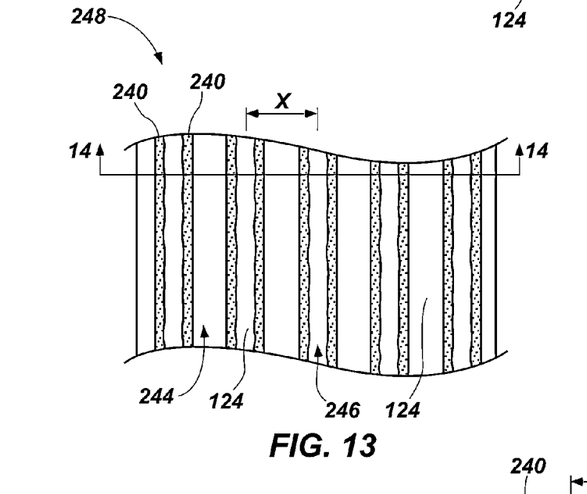
FIG. 13 is a top plan schematic illustration of a defined mask pattern during a stage of fabrication of a semiconductor device structure according to an embodiment of the present disclosure, the illustrated stage following that illustrated in FIG. 11.
Figure 14:
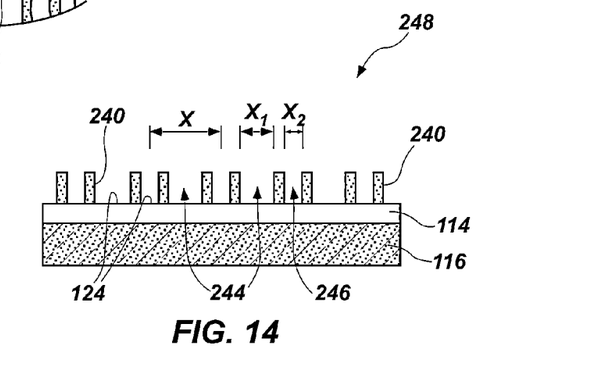
FIG. 14 is a cross-sectional elevational schematic illustration taken along line 14-14 of FIG. 13.

The trimmed features 232 of the patterning material 112 may then be removed while leaving the spacers 240, as illustrated in FIGS. 13 and 14. Methods for removing the patterning material 112, such as a photoresist material, of the trimmed features 232 without removing a spacer, such as spacer 240, are known in the art and therefore are not described in detail. The remaining spacers 240 define other openings 246 of width $X_2$. Depending on the thicknesses of the trimmed features 232 and the spacers 240, in some embodiments, the width $X_1$ of openings 244 may be about equal to the width $X_2$ of other openings 246. The remaining openings 244 and the other openings 246 define a masking pattern 248 of the spacers 240, which masking pattern 248 may be transferred to the base material 114 to form two features in the base material 114 for every one of the trimmed features 232 formed prior to the pitch multiplication process.

Notably, widths $X_1$ and $X_2$ are, together, less than the starting pitch X. Because the dimensions of the masking pattern 248 are so small, forming the spacers 240 precisely is often important. Because the spacers 240 are formed on the trimmed sidewalls 236 (FIG. 8) of the trimmed features 232, it is therefore often important to form the trimmed features 232 with precision, e.g., with minimized feature width roughness, with a precise elevational profile, and with sufficient height. Accordingly, utilizing the trimming chemistries and methods of embodiments of the present method may be well suited for use in pitch multiplication processes.

The forgoing methods and chemistries may be used not only for achieving critical dimensions with fewer imperfections in the resulting formed patterning material features, they can also be used for trimming other carbon-based materials and for cleaning surfaces of carbon-based materials (e.g., polymer "descumming").

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A method of forming a semiconductor device structure, comprising:
   forming a patterning material over a base material;
   exposing the patterning material to a chemistry comprising sulfur dioxide and a halogen-based compound while applying a bias power to remove at least a portion of the patterning material and define a plurality of features in the patterning material;
   after exposing the patterning material to the chemistry comprising sulfur dioxide and the halogen-based compound while applying the bias power, stopping the bias power and exposing the patterning material to the same chemistry comprising sulfur dioxide and the halogen-based compound to alter a lateral dimension of the features of the plurality of features and form a pattern of trimmed features; and
   exposing the base material to the same chemistry comprising sulfur dioxide and the halogen-based compound while applying the bias power to remove at least a portion of the base material.

2. The method of claim 1, wherein exposing the base material to the same chemistry while applying the bias power comprises transferring the pattern of trimmed features to the base material.

3. The method of claim 1, wherein stopping the bias power and exposing the patterning material to the same chemistry comprising sulfur dioxide and the halogen-based compound comprises exposing the patterning material to a plasma comprising the sulfur dioxide and the halogen-based compound.

4. The method of claim 1, wherein stopping the bias power and exposing the patterning material to the same chemistry comprises simultaneously exposing the plurality of features to the sulfur dioxide and the halogen-based compound.

5. The method of claim 1, wherein forming a patterning material over a base material comprises forming a photoresist material over an antireflective coating material on the base material.

6. The method of claim 1, wherein stopping the bias power and exposing the patterning material to the same chemistry comprising sulfur dioxide and the halogen-based compound comprises exposing the patterning material to a chemistry comprising the sulfur dioxide and an organohalogen compound.

7. The method of claim 6, wherein exposing the patterning material to a chemistry comprising the sulfur dioxide and an organohalogen compound comprises exposing the patterning material to a chemistry comprising the sulfur dioxide and at least one of $CF_4$, $C_3F_8$, $C_4F_8$, $C_4F_6$, $CHF_3$, and $CH_2F_2$.

8. The method of claim 1, wherein stopping the bias power and exposing the patterning material to the same chemistry comprising sulfur dioxide and the halogen-based compound comprises forming the pattern of trimmed features, the trimmed features having a feature width roughness of about 28 Å with a three sigma distribution.

9. The method of claim 1, wherein exposing the patterning material to a chemistry comprising sulfur dioxide and a halogen-based compound while applying a bias power to remove at least a portion of the patterning material and define a plurality of features in the patterning material comprises removing at least the portion of the patterning material to define the plurality of features in the patterning material, the features of the plurality of features having a feature width roughness of about 55 Å with a three sigma distribution.

10. The method of claim 1, wherein stopping the bias power and exposing the patterning material to the same chemistry comprising sulfur dioxide and the halogen-based compound comprises exposing the patterning material to a halogen-based compound comprising a compound including at least one of double-bonded carbon atoms and a carbon ring.

11. A method of forming a semiconductor device structure, comprising:
    exposing a photoresist material to an etchant consisting of sulfur dioxide and at least one halogen-based compound in the presence of a bias power to form resist features;
    exposing the resist features to the etchant in the substantial absence of the bias power to reduce a width of each of the resist features;
    transferring a pattern of the resist features to a hardmask material through the resist features to form features in the hardmask material; and
    exposing the hardmask material to the etchant in the presence of the bias power to reduce a width of the features in the hardmask material.

12. The method of claim 11, wherein exposing a photoresist material to an etchant consisting of sulfur dioxide and at least one halogen-based compound comprises selectively removing segments of the photoresist material to form elongate resist features.

13. The method of claim 11, wherein exposing the resist features to the etchant comprises:
    laterally etching the resist features at a lateral etch rate of about 4 Å/s to about 7 Å/s; and
    vertically etching the resist features at a vertical etch rate about 1.8 times faster than the lateral etch rate.

14. The method of claim 11, wherein exposing the resist features to the etchant comprises exposing the resist features to a halogen-based compound selected from the group consisting of at least one of $CF_4$, $NF_3$, $SF_6$, $ClF_3$, $C_3F_8$, $C_4F_8$, $C_4F_6$, $CHF_3$, and $CH_2F_2$.

15. The method of claim 11, wherein exposing the resist features to the etchant comprises exposing the resist features to the etchant comprising from about 0.1 part to about 10 parts of the at least one halogen-based compound for every 1 part of the sulfur dioxide.

16. The method of claim 11, wherein exposing the resist features to the etchant comprises exposing the resist features to the etchant consisting of at least one of:
   from about 0.2 part to about 10 parts $CF_4$;
   from about 0.2 part to about 10 parts $SF_6$;
   from about 0.2 part to about 10 parts $NF_3$;
   from about 0.2 part to about 5 parts $ClF_3$;
   from about 0.2 part to about 10 parts $Cl_2$;
   from about 0.1 part to about 5 parts $CHF_3$; and
   from about 0.1 part to about 2 parts $CH_2F_2$
per every 1 part of sulfur dioxide.

17. The method of claim 11, further comprising:
   forming a spacer material over each of the resist features; and
   removing the resist features.

18. The method of claim 17, wherein forming a spacer material comprises forming spacers over adjacent resist features, each spacer separated from adjacent spacers a distance about equal to a width of the resist features.

19. The method of claim 11, wherein exposing the resist features to the etchant in the substantial absence of the bias power to reduce a width of each of the resist features comprises forming each of the resist features to have a critical dimension of less than about 25 nm.

20. A method of forming a semiconductor device structure, comprising:
   forming a resist material over a base material;
   forming a polymer material over the resist material;
   after forming the polymer material, selectively removing portions of the resist material to define trenches in the resist material; and
   exposing the resist material to a plasma comprising sulfur dioxide and at least one material selected from the group consisting of $C_3F_8$, $C_4F_8$, $C_4F_6$, $SF_6$, $NH_3$, $ClF_3$, $BCl_3$, and $CF_3I$ to widen the trenches and remove the polymer material.

21. The method of claim 20, wherein selectively removing portions of the resist material comprises exposing the portions of the resist material to the plasma while subjecting the base material to a bias power of less than about 50 V to define the trenches in the resist material.

22. The method of claim 21, wherein exposing the resist material to a plasma comprises exposing the resist material to the plasma while applying the bias power.

23. The method of claim 20, further comprising exposing the resist material to a curing chemistry prior to exposing the resist material to a plasma.

24. The method of claim 23, wherein exposing the resist material to a curing chemistry comprises exposing the resist material to a curing chemistry comprising HBr.

* * * * *